United States Patent [19]

Lamiraux

[11] Patent Number: 4,547,777
[45] Date of Patent: Oct. 15, 1985

[54] METHOD OF RADIO-POSITION-FINDING THROUGH DETERMINATION OF PHASES OF ELECTROMAGNETIC WAVES AND RECEIVING DEVICE FOR PRACTICING THE METHOD

[75] Inventor: Christian Lamiraux, St Sebastien sur Loire, France

[73] Assignee: M.L.R. Electronique, France

[21] Appl. No.: 347,354

[22] Filed: Feb. 9, 1982

[30] Foreign Application Priority Data

Feb. 13, 1981 [FR] France ................ 81 02906

[51] Int. Cl.⁴ .............................................. G01S 3/64
[52] U.S. Cl. .................... 343/394; 343/395; 364/452; 455/77; 455/195
[58] Field of Search ............. 343/385, 386, 394, 395, 343/417, 393; 364/452, 449; 455/77, 87, 150, 168, 191, 195, 196, 340

[56] References Cited

U.S. PATENT DOCUMENTS

| | | | |
|---|---|---|---|
| 3,689,926 | 9/1972 | Honore et al. | 343/394 |
| 3,968,493 | 7/1976 | Last et al. | 343/394 |
| 3,974,502 | 8/1976 | Phipps | 343/397 |
| 4,092,594 | 5/1978 | Baker | 455/77 X |
| 4,368,541 | 1/1983 | Evans | 455/195 X |

Primary Examiner—Theodore M. Blum
Assistant Examiner—John B. Sotomayor
Attorney, Agent, or Firm—Steinberg & Raskin

[57] ABSTRACT

A method of radio-position-finding by means of mapped contour lines of iso-phase shift between two radio-frequency waves separated by a low frequency and transmitted by a group of foci stations also emitting a reference wave associated with said two radio-frequency waves and modulated upon said low frequency, consisting in determining in a receiver set the low frequency from which fundamental frequencies are received and as a reference value the low frequency which is modulated upon the reference wave and defines through comparison of the values thus obtained the relative phase shift of both fundamental frequencies, and likewise determining the phase shift between the fundamental waves transmitted by another group of foci stations, and comprising the steps of using one single receiving channel, determining during successive periods the low frequencies from the fundamental waves and the low reference frequencies, correcting through computation the values thus obtained for removing the shift in time and then comparing the values corresponding after their correction to the same times for obtaining the phase shifts.

9 Claims, 6 Drawing Figures

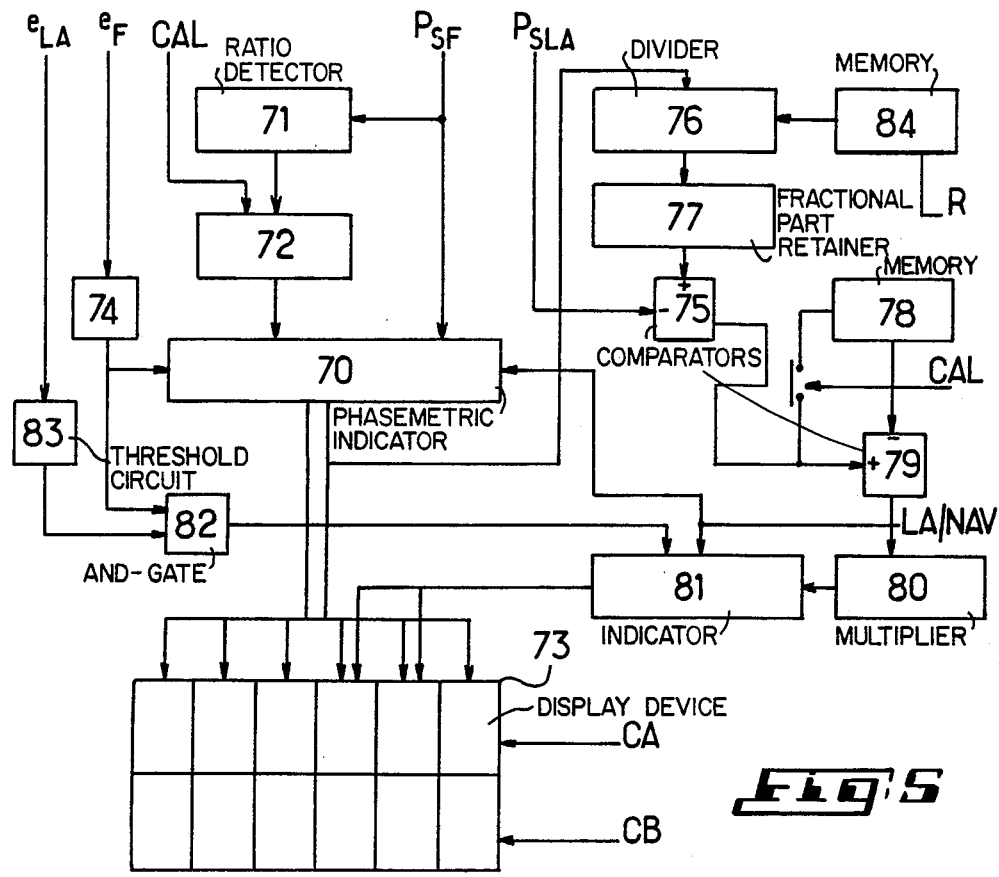
_Fig. 5_
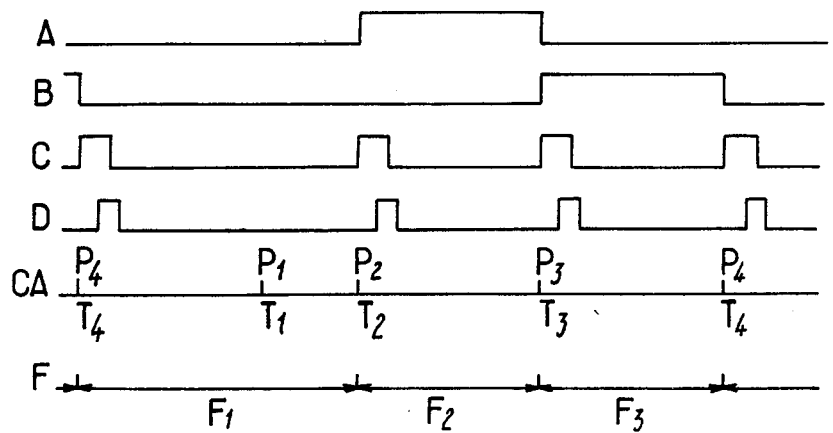
_Fig. 6_

METHOD OF RADIO-POSITION-FINDING THROUGH DETERMINATION OF PHASES OF ELECTROMAGNETIC WAVES AND RECEIVING DEVICE FOR PRACTICING THE METHOD

The present invention relates to a method of radio-position-finding for the radio-location of a receiving station through determination of the phase shift between electromagnetic waves transmitted by the stationary foci stations and by means of mapped contour lines, curves or charts of iso-phase shift of such waves. The invention is also directed to a receiver device for using, performing or carrying out the method.

Suitable processes and devices are already known for performing a radio-location or radio-position-finding in the aforesaid manner, the principle of which is disclosed in the French Pat. No. 790,386. According to that patent a co-ordinate of the position of a movable station called "hyperbolic position locus" is obtained by using two radio-electric channels with sharply-spaced or separated center frequencies. Two remote-located first stationary foci stations are transmitting waves spaced or separated from each other by a low frequency of a few tenths of hertzs. A third stationary station is receiving both waves and would extract the low difference frequency signal which it transmits as an amplitude modulation of a carrier frequency sharply spaced or separated from that of the foci stations. The position finding or locating receiver would receive on two channels the waves sent from the stationary stations and would extract the low frequencies through amplitude detection or sensing and the measuring of the relative phase which is representative of the difference between the distances separating the receiver from both foci would be carried out. To get one point one is led according to this principle to use a second transmitter network, thereby leading to process the signals from four radio-electric channels.

A simplification relative to the number of channels required for obtaining two independent hyperbolic loci is described in the "BULLETIN HYDROGRAPHIQUE INTERNATIONAL", chapter 6, of Apr. 3rd, 1960 relating to the system known under the name of LORAC B. The system only uses two frequency channels for carrying out a positioning or locating chain. On a first channel three stationary primary stations forming two pairs of foci emitting three pure frequencies spaced two by two by two distinct low frequencies. A fourth so-called modulated reference station radiates on the second channel a wave modulated at one and the same time by both low frequency signals which are each one characterizing a pair or couple of foci transmitters. The movable receiver comprises two amplification channels with amplitude detection or sensing. At the outputs of both channels the low frequencies which have been selected to be distinct may be separated and properly switched onto two phase measuring apparatus or implements for getting both hyperbolic indications.

In parallel relationship on these transmitting networks which are called fundamental networks, the foci stations may radiate a second pure frequency the magnitude of which is in a known arithmetic relation to the fundamental frequency of the foci. Thus is determined a new hyperbolic network according to the principle defined by the French Pat. No. 1,010,811 relative to the ambiguity removal or sense determinations systems. It is known that the use of so-called ambiguity removing frequencies makes it possible to define new loci of positions which contribute in particular to the working safety or operating reliability.

The methods and devices for performing same which are known exhibit the major drawbacks that the receiving equipment required for receiving and processing the signals from a positioning or locating network is bulky or cumbersome and expensive since it has to amplify several radio-frequencies thereby compelling to use as many receiving channels and separate two low frequency signals through a carrier wave, thereby resulting in the use of a multiplicity of narrow-band filters on which the phase transfers have to be particularly stable, any differential error leading to a positioning or location error.

The object of the present invention is to provide a method and a device for using same which do not suffer from such an inconvenience.

For reaching that aim the method according to the invention is characterized in that it consists in using one single receiving channel, effecting during successive periods or time intervals the determination of the low frequencies from the fundamental waves and the determination of the low reference frequencies, correcting through computation the values thus obtained for removing the shift in time and then comparing the values corresponding to the same times for obtaining the phase shifts.

The receiver device according to the invention for performing the method is characterized in that it comprises one single receiving channel the tuning or. crossover frequency of which is switchable to the various frequency bands in which are the radio-frequency waves to be worked, during said successive periods or time intervals, and a microprocessor logical system for the control or operation of the change-over switching of the receiving channel and the correction through computation of the values determined during the successive time periods for the removal of the shifts in time.

The invention will be better understood and further objects, characterizing features, details and advantages thereof will appear more clearly as the following explanatory description proceeds with reference to the accompanying diagrammatic drawings given by way of non-limiting example only illustrating one presently preferred specific embodiment of the invention, and wherein:

FIG. 5 illustrates as a block diagram the system for processing and displaying or indicating the output signals provided by the logical receiver system according to the present invention; and FIG. 6 illustrates the co-ordination in time or timing of the control signals and the measuring times which determine the operation of the receiver device according to the present invention.

Figure 1:
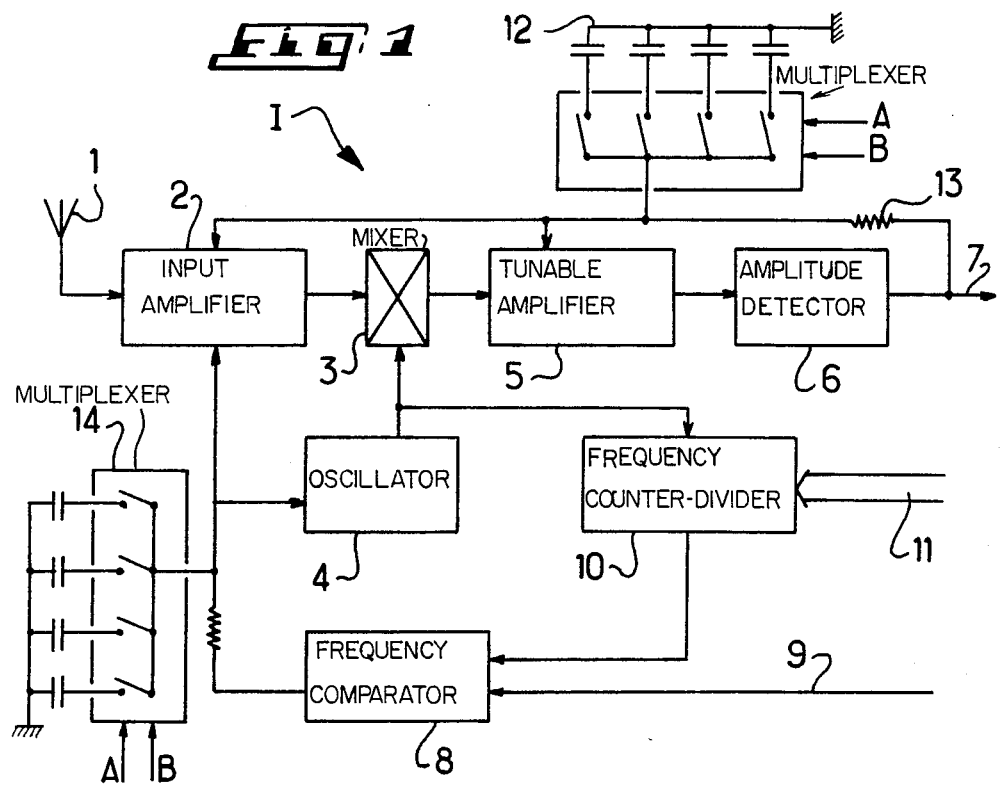
FIG. 1 is a block diagram of the receiving channel of the receiver device according to the invention.
Figure 2:
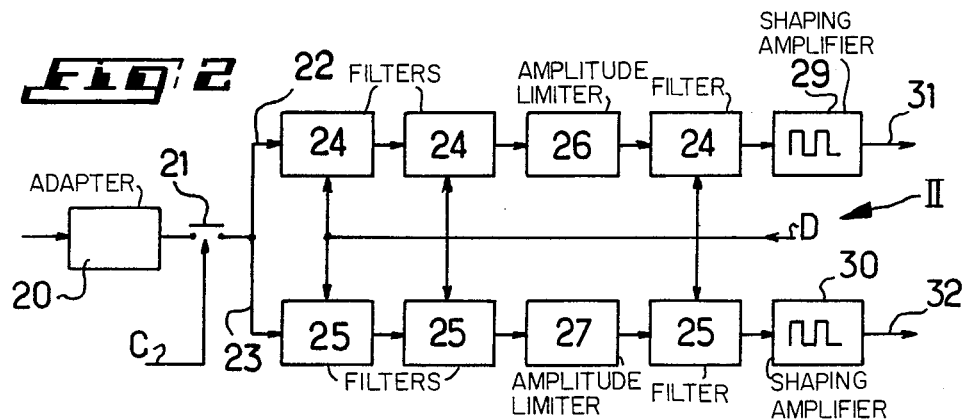
FIG. 2 is a block diagram of the low frequency separation channels.

In the embodiment of the invention which is shown on the Figures the receiver device according to the invention comprises one single channel I for receiving the signals caught or sensed by the antenna or aerial 1. FIG. 1 shows this receiving channel. The signals originate from the stationary foci stations not shown and comprise for instance a fundamental frequency band containing two couples or pairs of radio-frequency waves separated by a low frequency, respectively, a second frequency band containing a band modulated by both low frequency signals and a frequency band containing two ambiguity removing waves, each one in known arithmetic relationship with the fundamental frequency of one pair of waves. Such a channel is designed so that its tuning frequency be cyclically switchable over onto the various frequency bands received by the antenna or aerial 1 under the control of a logical device provided with a microprocessor and shown on FIG. 4. At each switching state the receiving channel provides two superposed low frequencies which are then separated from each other by a filtering and selection stage II (FIG. 2). Each low frequency signal is then transmitted to the logic device with microprocessor III shown on FIG. 4. This device corrects the signals shifted or offset in time and which have to be compared and will send them to the processing and displaying device shown in greater detail on FIG. 5.

The various component devices of the receiver according to the invention will now be described in greater detail.

The input channel I comprises according to FIG. 1 a tunable input amplifier 2. The input of the latter is connected to the antenna or aerial 1 and its output is connected to the input of a mixer 3 connected through another input to a local oscillator 4 the frequency of which is variable. The mixer 3 is designed to provide at its output a signal of intermediate frequency of constant value for instance of 430 kHz. This output signal corresponds to the difference between the signals which are applied thereto. The output of the mixer 3 is connected to the tunable amplifier 5 adapted to raise the signals received from the mixer 3 to a level of about 1 volt. The output of the amplifier 5 is connected to an amplitude detector or sensor 6. The latter provides low frequency signals of which it is desired to measure the phases and a component of direct current voltage representative of the amplitude of the electric field received on the radio frequency. The mean or average component is isolated by the low-pass filter having RC-elements. From the output of the amplifier 6 the low frequency signals are transmitted through the conductor 7 to the separator stage shown on FIG. 2.

Figure 4:
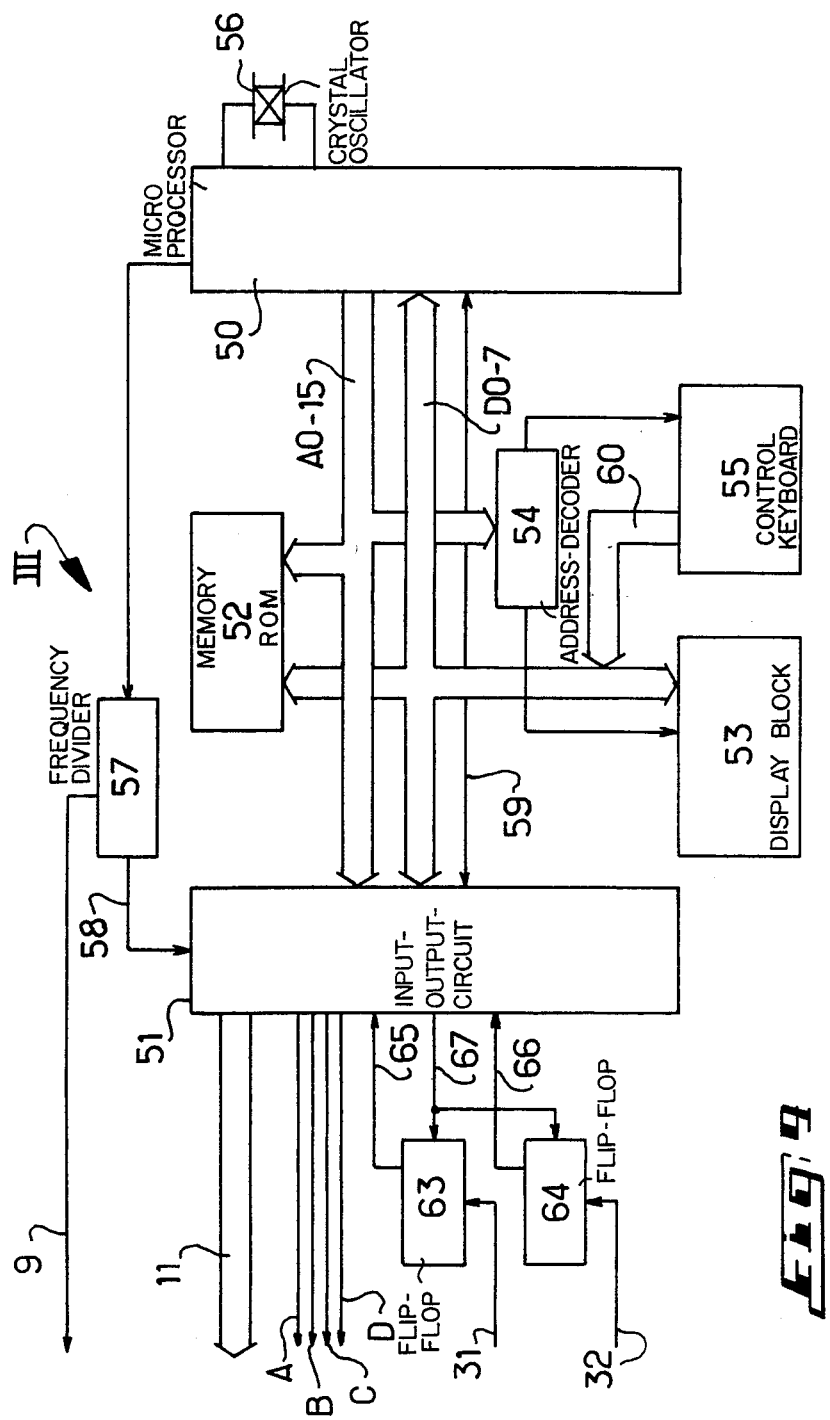
FIG. 4 is a block diagram of the microprocessor logical system of the receiver according to the present invention.

The tuning frequency of the input amplifier 2 and of the oscillator 4 are determined by means of diodes with variable capacities through a control or drive voltage supplied by a frequency comparator 8 which receives at an input through the agency of a conductor 9 a reference signal supplied by the microprocessor logic device (FIG. 4) and at another input the output signal from a counter-frequency divider 10 connected to the output of the local oscillator 4. The rate of division of the counter-divider 10 is controlled by a control "bus" with nine conductors 11 leading also from the logical device (FIG. 4). The frequency of the oscillator 4 is numerically defined by the selection of the rate of division of the counter 10. The tuning circuit of the oscillator 4 is compensated for by a trimming capacitor so as to keep a constant shift or swing equal to 430 kHz between the receiving frequency and the local frequency on the range extending from 1.6 to 2.6 MHz.

The gains of the amplifiers 2 and 5 are adjustable through retro-active or feedback application of the voltage at the output of the demodulator 6 through a resistor 13 to these amplifiers. A multiplexer 12 is provided which makes the connection of a capacitor for each one of the radio-frequencies to be amplified under the action of the logic signals A and B fed from the logic microprocessor device. The receiving channel moreover comprises a multiplexer 14 which connects one of several capacitors to the control inputs of the input amplifier 2 and of the local oscillator 4, also under the control of the logic signals A and B. The multiplexers 15 and 18 allow to minimize the rise or build-up time of the sensed signals by storing for each radio-frequency the pseudo-direct current servo-control voltages which are controlling or adjusting the tuning frequency and the gain on that frequency.

Figure 3:
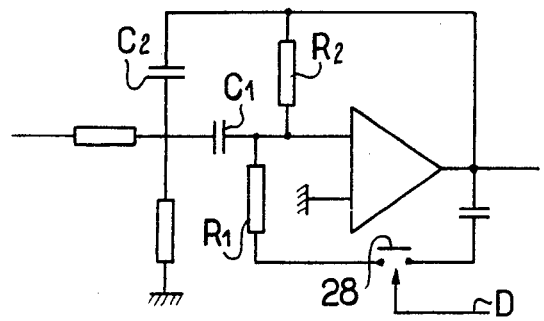
FIG. 3 shows a device or trap for filtering the separation channels according to FIG. 2.

FIG. 2 shows the arrangement of the separator stage II for the low frequencies sensed by the amplitude detector 6 and received through the conductor 7. That separator stage comprises an adapter 20 performing the function of a separator. It is adapted for adjusting or controlling the energizing level of the filtering devices or traps and for reducing the voltage components which follow the switchings or commutations of the HF-tuning frequency. That function is completed by a transient signal switch 21 which remains open under the action of a signal C for a period of about 15 msec. The signal C is supplied by the logic microprocessor device according to FIG. 4. The separator stage comprises two low frequency selection channels 22, 23 consisting each one of several filtering devices or traps 24, 25 mounted in series and of an amplitude limiter 26, 27 inserted in the example shown between the second and the third filtering device. As appearing from FIG. 3, each filtering device or trap is carried out as an active band-pass filter the tuning frequency of which is defined by the resistors R1, R2 and the capacitors C1, C2 and the coefficient of overvoltage or voltage surge is an increasing function of the ratio R2/R1 when the switch 28 is open. The latter closes under the action of an initializing signal D supplied by the logic device (FIG. 4). The closing of this switch 28 lowers the coefficient of the active filter down to a small value of the order of magnitude of the unity while making it quickly take again the initializing potential which corresponds to the application of a zero amplitude signal. The filtered signals are then built up within the filtering devices 24, 25 so as to reach their final value at the transition of the signal A which follows. The sensed signal is then cut off the filters by the switch 21 while keeping their oscillating energy until the appearance of the signal D. Each selection channel comprises at its output a shaping amplifier 29, 30 providing each one at its output a square wave in phase with the filtered low frequency. The square waves are fed through the conductor lines 31, 32 to the inputs of the phase measuring circuit which is a part of the logic microprocessor device according to FIG. 4 which will be referred to hereinafter.

According to that FIG. 4, the logic device essentially comprises a microprocessor 50, an input-output circuit 51, a memory or storage circuit 52, a display block 53, an address decoder 54 and a control keyboard 55.

The micrprocessor supplies at one output a signal for instance of 1 MHz obtained from a crystal diagrammatically shown at 56. That microprocessor output is connected to a frequency divider 57 which feeds through the agency of a conductor line 58 to the input-output circuit 51 a logical signal having for instance a period equal to 6.144 msec. The frequency divider 57 has an intermediate output from which may be taken the reference signal supplied through the conductor line 9 to the frequency comparator 8 of the receiving channel (FIG. 1). The reference signal has a period of 512 msec. Responsive to the signal of 6.144 msec, the input-output circuit supplies the microprocessor 50 through a service bus 59 with an interruption signal used in a monitoring programme for generating through counting the control signals A, B, C and D forming multiplexing signals and for providing in synchronized relationship digital data of the bus 11 which extends to the counter-divider 10 of the input channel and which defines the rate of division of that counter and thereby the frequency of the local oscillator 4 and therefore defines the value of the radio-frequency being in the course of acquisition.

The microprocessor 50, the input-output circuit 51 and the memory or storage circuit 52 are interconnected between each other according to a conventional address and data scheme which may be found in the handbooks giving instructions or directions for use of the microprocessor circuits of the 6800 family. Such a scheme is represented on FIG. 4 by an address bus AO-15 and a data bus DO-7. The memory circuit 52 is a 2K.octets (8-bit byte) storage which contains the processing programme which will be dealt with hereinafter. The microprocessor 50 which is of the type 6802 contains 128 octets of random access memory or so-called RAM for the storage of the intermediate data provided in the course of the programme. The data bus DO-7 supplies the information to the display or readout block 53 and receives information from the control keyboard 55 through a bus 60. The readout or display block 53 and the control key board 55 are addressed by the microprocesor 50 through the agency of the address decoder 54 connected to the address bus AO-15, as appearing from the Figure. The service bus 59 also makes possible the transmission of the controls for the initialization of the starting up of the circuit 51 and of the microprocessor 50, originating from an outer feed circuit.

As stated hereinbefore, the logical device according to FIG. 4 allows the build up of the phase shifts of the low frequencies available on the conductor line 31, 32 at the outputs of the selection channels 22, 23 of the separator shown on FIG. 2. The measures of the phases of these signals are carried out through the agency of flip-flop devices or bistable multivibrators 63, 64 the outputs of which are respectively connected to the inputs 65 and 66 of the input-output circuit 51. The reset terminals of these flip-flop devices or bistable multivibrators are connected to a terminal 67 of the circuit 51 at which is generated a reset pulse in synchronized relationship with the multiplexing cycle.

Before describing the readout or display block of the receiver device shown on FIG. 5 and adapted to display or visualize information which is fed thereto by the logical device, the essential operating steps performed by the various devices of the receiver and in particular of the logical device should at first be explained. These operating steps are explained in particular with reference to FIG. 6.

FIG. 6 shows a chronogram of the multiplexing signals A, B, C and D, of the various multiplexing periods and of the times of measure taking or pickup. The line F illustrates the successive periods of switching of the input channel (FIG. 1) of the receiver device according to the invention onto the frequency bands F1, F2 and F3 simultaneously received by the antenna. The frequency band F1 contains the fundamental radio frequencies of both pairs of stationary foci stations CA and CB. The fundamental frequencies of each pair are separated by a low frequency. Both low frequencies are different. The band F2 contains both reference frequencies modulated for instance upon a same carrier wave. F3 shows the band containing the ambiguity removal frequencies. The line CA shows the times T1 to T4 at which are taken the phase measures relative to the signals of the pair of stationary foci stations CA and the values P1, P2, P3 and P4 represent the magnitudes collected at these times. The times of the measures relative to the signals originating from the pair of stationary foci stations CB are not shown since these signals are processed in the same way and almost at the same time as the signals from the pair CA.

During a switching cycle according to FIG. 6, the receiving channel (FIG. 1) is at first switched onto the frequency band F1 through proper tuning of the oscillator 4 and of the amplifiers 2 and 5 as initiated by multiplexing signals A, B. The mixer 3 effects a beat or heterodyning of the radio-frequency waves of both fundamental pairs CA and CB. The amplitude detector 6 then generates both low frequency signals characterizing both pairs. These signals are separated in the separator stage (FIG. 2) and converted into square signals and are then fed to the flip-flop devices or bistable multivibrator devices 63, 64 of the logical device according to FIG. 4. After a counting time of 20 periods of the interruption signal of 6.144 msec fed by the input-output circuit 51 to the microprocessor 50 through the bus 59 hence after a time of about 123 msec following the buildup of the receiving frequencies, the operative step of measuring the value of the phase P1 is initiated or started at the time T1. For that purpose the input-output circuit 51 generates at its terminal 67 the pulse resetting both flip-flop devices or bistable multivibrators 63 and 64. Simultaneously according to its programme the logical device begins a period of time counting timed by the clock frequency of 1 MHz generated by the microprocessor 50. The first positive transition of a low frequency signal applied by the corresponding conductor line 31, 32 to the flip-flop device 63 or 64 which follows the resetting, will set to one again the output of that flip-flop device. The information is fed to the terminal 65 or 66 of the circuit 51 and conveyed to the data bus DO-7. The counting relating to that flip-flop device is stopped and the recorded duration is correlated through computation with the value of the presumed period of the measured signal to provide a phase value expressed in hundredths of revolutions of a rotary phasemeter, relative to the phase of the reset pulse. During this same switching period is carried out at the time T2 a second measuring step which is the same as the one just described. The time which separates both moments T1 and T2 is advantageously chosen to be equal to one half of the foregoing time, i.e. the interval T4−T1. The measure values P1 and P2, both performed on F1 will serve to define the true period of each one of both measured low frequency signals.

The receiving channel is then switched over onto the frequency band F2 containing the reference frequencies. After proper processing of these signals the separator stage conveys two low reference frequency signals to the flip-flop devices 63 and 64. As previously after a time of about 123 msec following the switching step the phase value P3 is measured at the time or moment T3. At last the receiving channel is switched over onto the ambiguity removing frequencies F3. At the time T4 after a waiting or idle time of about 123 msec, the value P4 is measured.

It is known that for providing phase shifts of the pairs of fundamental frequencies and the phase shift of the ambiguity removing frequencies it is necessary to correlate the corresponding values with the reference values. Now the operative steps of correlation or comparison require a correction of the measured values for removing their shift or offset in time due to the multiplexing.

Such a correction is made in the microprocessor according to a predetermined programme. The microprocessor determines the period difference Ep by establishing the difference between the phase values P1−P2 and by averaging or taking the mean of the differences obtained at each cycle according to equations corresponding to the behaviour of a first order filter with a time constant of 20 seconds. From the measured phase values P1 to P4 and the period difference Ep, the microprocessor derives the instantaneous fundamental phase Pmf by making the difference P2−P3 and by correcting twice the value of the difference Ep. It determines the ambiguity removing phase Pm.LA by effecting P4−P2 corrected by three times Ep.

$$Pmf = P2 - P3 + 2EP$$

$$Pm.LA = P4 - P2 + 3EP$$

This method of correction allows to define the true relative phases of the three types of signals received at distinct moments. This method is very advantageous because it does not require any synchronous clock or a clock made synchronous through servo-control by or following-up interlock with the signals to be measured.

The actualized phase values are then undergoing within the microprocessor 50 a treatment corresponding to that of a phase filter which generates for each one of the data the filtered mean phase Ps, the phase velocity V and the mean of the differences e established by filtering the absolute value of the differences between the filtered phase and the measured phase. This process similar to that of a phase filter satisfies the equations of a second order filter well known in the art:

$$V_{(t+1)} = V_{(t)} + K1(Pm - Ps_{(t)})$$

$$Ps_{(t+1)} = Ps_{(t)} + K2(Pm - Ps_{(t)}) + V_{(t)}$$

$$e_{(t-1)} = e_{(t)} + K3((\text{Abs. Val.}(Pm - Ps_{(t)})) - e_{(t)})$$

These equations make sure that the mean values are always followed and actualized. In these equations K1, K2 and K3 are constants. K1 and K2 are selected to provide the tightest filtering while allowing to follow the phase accelerations resulting from the changes in the path of a moving body travelling at a maximum speed of 30 km/h. The filtered information e will characterize the scatter of the successive measures Pm. Each difference is representative of the quality of reception of the filtered signal. Compared with a threshold, e is used in the sequence of the programme for enabling the position data displayed on the display block 53 (FIG. 4). The logical device generates mean filtered phase values $P_{sf}$ and Ps.LA and filtered data $e_{LA}$ and $e_F$.

The process carried out on both filtered phases relative to a pair or couple of foci transmitters $P_{sf}$ and Ps.LA is illustrated on the block diagram of FIG. 5 which will be referred to hereinafter.

The enclosed flow-charts illustrate the program along which the microprocessor device proceeds for establishing the signals $P_{sf}$ and $e_F$. In the same way, the system develops the signals $P_{s.LA}$ and $e_{LA}$.

The program is established to enable the microprocessor device 50 to accomplish the operations necessary for performing the equations set forth on page 11 of the present disclosure.

For this purpose, the microprocessor device 50, which may be constituted by the microprocessor 6802 of MOTOROLA, contains a memory of the type RAM of 128 octets, as set forth on page 8, lines 4–8 of the present disclosure.

The microprocessor comprises accumulators A, B and a status register for furnishing flag values. In the RAM, there are provided memory places for the values $P_{sf}$, $e_F$, $P_{s.LA}$, $E_{LA}$ and the phase velocity $V_{SF}$.

The program according to which the different operations are effected is stored in the memory 52, which is a 2K octets memory of the type RAM, such as set forth in the first paragraph of page 8 of the present application.

The different operations carried out by the microprocessor device 50 for establishing the values or signals $P_{sf}$, $P_{s.LA}$, $E_F$ and $e_{LA}$ result from the enclosed flow-charts which are easily understandable with reference to the equations of page 11 of the disclosure.

It is to be noted that in these equations, only terms such as Pm and Ps, wherein the letters m and s indicate that these values are respectively measured and averaged values, are used. These values can belong respectively to the fundamental waves (indicated by the letter f) and to the ambiguity-removing waves (indicated by the term LA).

FIG. 7 shows the flow-chart for obtaining the mean phase difference EP constituting the correcting value for establishing the relative phase Pmf from the measured phase values EP, the position-finding low frequency of each pair of fundamental waves is measured twice during the time period $F_1$ (FIG. 6). Thus, the two phase values P1 and P2 are obtained. Their difference is established and stored in the accumulator A.

In the next step, the content of the memory A is corrected by the previously-established value EP and this term is multiplied by a constant K and the thus obtained value is stored in the accumulator B. A new, that is, actualized value EP, is obtained by adding to the previously-established value EP the content of the accumulator B. This actualized value EP is used for correcting the relative phase obtained from the measured phase values P2, P3. This permits the establishment of the value Pmf of the equation on page 11.

The flow-chart of FIG. 8 illustrates the manner of establishing actualized mean values Ps along the equation set forth on page 11 from the corrected measured phase values Pm and the filtered main phases Ps and the phase velocity V established previously, that is, during the foregoing switching cycle. In this equation, the actualized value is indicated by the term t+1 and the previously established values are indicated by the term t.

As follows from the flow-chart of FIG. 8, which indicates the establishment of the mean phase $P_{sf}$, that is, the mean phase of the fundamental waves, the corrected measured phase value Pmf is stored in accumulator A. The previously-established value $P_{sf}$ is then subtracted from the content of the accumulator A. The result constitutes the new content of the accumulator. The flag DRA of the status register is at zero. An operation is then carried out to determine whether the content of accumulator A is positive. If this is not the case, the flag is put into the position FF and the polarity of the content of A is inverted for retaining only the absolute value.

In the next step, the mean $e_F$ of the differences established by filtering the absolute value of the differences between the filtered phase and the measured phase is subtracted from the content of the memory A. The thus obtained term is multiplied by the coefficient $K_3$ and to this term is added the value $e_F$. These operations are carried out by means of the accumulator B. Then, the content of the accumulator B is stored in the memory places provided for the value $e_F$. The content of the accumulator A multiplied by the coefficient $K_1$ is then stored by the operator in the accumulator B.

In the following step, the content of B is inverted if the flag DRA is negative. Then, the previously-established phase velocity value $V_{SF}$ is added to the content of the accumulator B and the result is stored in the memory provided for $V_{SF}$. The memory $V_{SF}$ contains the new actualized value $V_{SF}$ corresponding to the term $V_{(t+1)}$ of the equation on page 11.

In the following step, the content of the accumulator A is multiplied by the coefficient $K_2$ and the result is stored in the accumulator B. If the flag DRA is different from zero, the content of B is inverted.

In the following step, one obtains the actualized value $V_{SF}$, that is, the value $Ps_{(t+1)}$ according to the equation of page 11, by adding to the previously-established value the content of the accumulator B and the content of the memory places for $V_{SF}$, and the result is stored in the memory places of $V_{SF}$.

This program is carried out during each switching cycle including measuring of the phase values P2, P3 and P4, according to FIG. 6. The program for establishing $P_{s.LA}$ and $e_{LA}$ corresponds to the aforedescribed program and presents the same structure.

At the input, the operator establishes PmLA = P4 − P2 + 3EP in the accumulator A and uses the memories $P_{s.LA}$, $V_{s.LA}$, $e_{LA}$, instead, respectively of the memories $P_{sf}$, $V_{SF}$ and $e_F$.

The flow-chart of FIG. 9 illustrates the program for interpreting particularly the ambiguity-removing in accordance with FIG. 5. For this purpose, the memory 84 includes a list of digit data concerning the values of the ratio n of each network R. The number R of the network permits by reference to the list, the obtaining of the ratio n concerning the network. In one application, the memory 84 comprises eight memory places for the networks R numbered from zero to seven. The memory 78 stores the values equal to the value delivered by the comparator 75 when the push device CAL is actuated.

The flow-chart 9 illustrates the corresponding program.

The fundamental phase $P_{sf}$ is applied to a phasemetric indicator 70 as two decimal digits which determine the fractional part of the estimated phase. The signal $P_{sf}$ is moreover fed to a ratio detector or sensor 71. The latter is connected to a four decade-incremental counter 72 for causing same to move up by one unit each time that $P_{sf}$ makes one full revolution in the increasing direction or to move down by one unit when the direction is decreasing. The decoder 72 has a setting input CAL.

The content of the counter 72 is fed to the indicator 70 as four decimal digits which determine the whole or integer part of the estimated phase $P_{sf}$. The indicator 70 acts upon a display device 73 with two series of six digits, namely one series for displaying the phase $P_{sf}$ relative to the couple or pair CA and the other series for displaying $P_{sf}$ relative to the other pair or couple CB. For setting the estimated phase the counter 72 is adjusted or positioned by acting upon two up-down keys of the control keyboard 55 (FIG. 4).

It should be pointed out that the estimated phase $P_{sf}$ applied to the indicator 70 is enabled through comparison of the signal $e_F$ delivered by the logical device in a threshold circuit 74 to a predetermined threshold above which $e_F$ will trigger or gate a reception defect signal.

The working or use of the ambiguity removing phase Ps.LA is performed according to the well-known principle defined in the French Pat. No. 1,010,811 of 1948. The ambiguity removing frequency and the fundamental frequency of a transmitter pair of foci stations are correlated by a ratio n called ambiguity removing ratio:

ambiguity removing frequency = 1 + 1/n × fundamental frequency.

The ratio n may be fractional and lie between 3 and 9 and is defined by the mapping relative to each pair or couple of foci. The general principal states that when the fundamental phase makes n revolutions owing to the displacement of the receiver, the differential phase i.e. the phase of the ambiguity removing frequency minus the phase of the fundamental frequency, which is herein called ambiguity removing phase Ps.LA makes one revolution exactly. The ratio n is specific for a network.

The display block comprises a comparator-subtractor 75. At one input of the latter is applied the value Ps.LA delivered by the logical device. The comparator receives at another input a value derived from the fundamental phase $P_{sf}$ taken from the input of the indicator 70, through division by n in a divider 76. The ratio n has previously been fed to this divider by a memory or storage device 84 in which the ratios n are entered or written into memory in front of or in registering relationship with the frequency data of each one of the networks. The quotient or ratio $P_{sf}/n$ made by the divider 76 is equal to Ps.LA but may be incorrect in view of the setting of the counter 72. It should also be pointed out that at 77 has been retained the fractional portion through limitation to two digits after the point. The comparator-subtractor 75 makes it possible by comparing these two input values to obtain the uncorrected setting difference which exists between the phases taking into account the estimated value fed into the counter 72. This uncorrected difference may be corrected by a device symbolized as a memory 78 with the assistance of another comparator-subtractor 79. The output of the latter is connected to a multiplier 80 multiplying by the ratio n to get a phase value of the same sensitivity as that exhibited by the phase display of the fundamental network. The digital datum centred about zero may reach ±n/2 phase revolutions. The output signal from the multipler 80 is fed to an indicator 81 indicating the phase Ps.LA. The display is conditioned within the indicator 81 by the values éLA and $é_f$ by means of an AND gate 82 which receives at one input thereof the output from the threshold circuit 74 to which is applied the signal $é_f$. To its other input is connected a second threshold circuit 83 which is connected to the input terminal for the signal éLA.

The mode of representation chosen allows an easy construction or ready interpretation of the result of the processing. On request of the operator the datum of the indicator 81 is substituted for the display of the estimated fundamental phase instead of the digits involved by the information. The nonsignificant digits will vanish or extinguish themselves so as to make appear the units and the tenth of revolution only. The ideal setting is shown by the display of 0.0 upon admitting a fluctuation or variation by 0.3 revolution under the influence of the reception noises. An upward shift or offset is shown by the display of 1.0±0.3 whereas a downward offset or shift is shown by 9.0±0.3 and so on until reaching n/2 in positive differences and 10−n/2 in negative differences.

The initial setting consists in making the difference vanish through the correction memory 78. The operation is performed once and for all at a known geographical mark where the data fed into the counter 72 are deemed to be reliable or dependable. The control is carried out through the input keyboard by simultaneously depressing or pushing on one key provided for the pair or couple and one key designated by the reference characters LA/NAV. The uncorrected ambiguity removing difference is then entered or recorded into the memory 78 which while delivering its datum will make zero or vanish the output difference. The key LA/NAV used alone serves to operate the display of the ambiguity removing data upon both pairs of foci.

The arrangement described for the acquisition of the phases and the processing is designed to allow the receiver device according to the invention to locate or position itself within all radio-locating links or chains complying with the characterizing feature previously defined. With a link or chain is generally meant a system with two hyperbolic co-ordinates covering a determined geographical area and which may be fitted with an ambiguity removing frequency. The memory of the central unit contained within the logical microprocessor device contains for that purpose the list of the transmission frequencies of each link or chain written in a suitable order and which allows the processing according to the process described. Each chain or link numbered from 0 to 7 may be selected by the control keyboard 55 by depressing or pushing on the network key shown on FIG. 5 by the reference character R and by incrementing the network number which appears then on the display block. A keyboard programme periodically acted upon or urged by the monitoring programme is managing the tasks or jobs for initializing and controlling the representation mode. The display block of the multiplexed control type is controlled or operated by the interruption programme.

Although the receiver device which has just been described is in particular designed for maritime purposes or uses it should be noted that the invention is not limited to such an application.

It should be understood that the invention is not at all limited to the embodiment described and shown which has been given by way of illustrative example only. In particular it comprises all the means constituting technical equivalents of the means described as well as their combinations if same are carried out according to its gist and used within the scope of protection as claimed.

What is claimed is:

1. A receiver device for radio-position-finding in which the position of a vehicle is determined by the intersection of an iso-phase shift hyperbola line of a first family of radio frequency waves with the iso-phase shift hyperbola line of a second family of radio frequency waves and advantageously by ambiguity-removing frequency waves, each family comprising a pair of fundamental radio frequency waves separated by a position-finding low frequency and a reference radio frequency wave modulated by the low frequency separating said fundamental waves and serving as a reference low frequency, the low frequencies of said families being different from one another, and wherein the low frequency position-finding frequency is developed from each pair of fundamental waves, the low reference frequency modulated thereon is developed from the reference radio frequency wave, the corresponding low frequencies are developed from said ambiguity-removing frequency waves, and the position of the vehicle is established by determining the relative phase between the position-finding low frequencies and the reference low frequencies of each family of radio frequency waves, and wherein said fundamental waves, said reference waves and said ambiguity-removing waves are received in successive cycles during predetermined successive time periods within each cycle, respectively, the relative phase of the corresponding low frequencies received sequentially and developed sequentially is established, and said relative phase values are corrected by computation by a correction value obtained by averaging the phase shift difference measured during each cycle on the same signal, said receiver device being used on a vehicle in order to determine the position thereof and being adapted to receive said two radio frequency wave families each comprising a pair of radio-position-finding frequency waves separated by a low frequency forming a position-finding low frequency and a reference radio wave modulated by said low frequency forming a reference low frequency, advantageously by ambiguity-removing frequency waves, said pairs of position-finding radio frequency waves being situated in a first frequency band, said reference radio frequency waves being situated in a second frequency band and said ambuiguity-removing frequency waves being situated in a third frequency band, said receiver device comprising a single receiver channel the tuning frequency of which is switchable over onto said different frequency bands during successive time periods and a microprocessor system adapted for controlling the switching of said receiver channel and for establishing said relative phase of each family of radio frequency waves and of the average phase shift differences forming said correction values and taking into account the shift in time of the measuring of the position-finding low frequencies with respect to the reference low frequencies due to the sequential switching of said single receiver channel on said different frequency bands and for correcting said relative phase values by said correction values, said receiving channel being an amplitude demodulating channel turnable successively to said various frequency waves under the control of said microprocessor device and being adapted to provide two low frequencies from both pairs of fundamental frequencies separated by a low frequency, a device for separating low frequencies being mounted downstream of said receiving channel whereas said logical microprocessor device comprises a clock signal generating oscillator, counter means for measuring the phases of the low frequency signals with respect to the phase of the clock signals and a central computation unit for delivering the phases representative of the hyperbolic position loci through correction of the measured values shifted in time.

2. A device according to claim 1, wherein said separator stage comprises within each separation channel, several active filter cells, a switch positioned upstream of both said channels and adapted to open under the action of a logical signal supplied from said logical microprocessor device at predetermined times of the radio-frequency multiplexing cycle for removing the transient pulse transfer produced by the change-over switching of the radio-frequency and for keeping the signals at their final value for a duration which permits performance of the phase measuring steps, and initialization switches adapted to put said filter cells at the beginning of each switching period in a state corresponding to the application of zero amplitude signals, when they are closed under the action of a logical signal from the logical microprocessor device.

3. A receiver device according to claim 1, wherein said oscillator means are adapted for producing local clock signals for switching said single receiving channel sequentially onto said different frequency bands, for initiating the steps of measuring the phases of said low frequencies and reference clock signals, for measuring the phases of said low frequencies by means of said counter means, said microprocessor device being further adapted to measure during the reception period of said fundamental waves said position-finding low frequencies at two moments separated by a time interval predetermined by said microprocessor device, to establish the phase difference of said two measured phase values and an averaged difference value from said phase differences to establish the relative phase between the low frequencies of each pair of fundamental frequency waves and correcting said relative phase by a value proportional to the corresponding averages difference value.

4. Receiver according to claim 3, said microprocessor device being further adapted to develop from said corrected relative phase values by computation mean phase values according to equations of a second order filter said mean relative phases being used for determining the location of said vehicle and being developed by forming the sum of the mean value determined at the foregoing switching cycle, a value proportional to the phase difference between the corrected measured phase and the mean phase of the previous cycle and the phase velocity which has been established for the previous cycle.

5. A receiver device for radio-position-finding in which the position of a vehicle is determined by the intersection of an iso-phase shift hyperbola line of a first family of radio frequency waves with the iso-phase shift hyperbola line of a second family of radio frequency waves and advantageously by ambiguity-removing frequency waves, each family comprising a pair of fundamental radio frequency waves separated by a position-finding low frequency and a reference radio frequency wave modulated by the low frequency separating said fundamental waves and serving as a reference low frequency, the low frequencies of said families being different from one another, and wherein the low frequency position-finding frequency is developed from each pair of fundamental waves, the low reference frequency modulated thereon is developed from the reference radio frequency wave, the corresponding low frequencies are developed from said ambiguity-removing frequency waves, and the position of the vehicle is established by determining the relative phase between the position-finding low frequencies and the reference low frequencies of each family of radio frequency waves, and wherein said fundamental waves, said reference waves and said ambiguity-removing waves are received in successive cycles during predetermined successive time periods within each cycle, respectively, the relative phase of the corresponding low frequencies received sequentially and developed sequentially is established, and said relative phase values are corrected by computation by a correction value obtained by averaging the phase shift differences measured during each cycle on the same signal, said receiver device being used on a vehicle in order to determine the position thereof and being adapted to receive said two radio frequency wave families each comprising a pair of radio-position-finding frequency waves separated by a low frequency forming a position-finding low frequency and a reference radio wave modulated by said low frequency forming a reference low frequency, advantageously by ambiguity-removing frequency waves, said pairs of position-finding radio frequency waves being situated in a first frequency band, said reference radio frequency waves being situated in a second frequency band and said ambiguity-removing frequency waves being situated in a third frequency band, said receiver device comprising a single receiver channel the tuning frequency of which is switchable over onto said different frequency bands during successive time periods and a microprocessor system adapted for controlling the switching of said receiver channel and for establishing said relative phase of each family of radio frequency waves and of the average phase shift differences forming said correction values and taking into account the shift in time of the measuring of the position-finding low frequencies with respect to the reference low frequencies due to the sequential switching of said single receiver channel on said different frequency bands and for correcting said relative phase values by said correction values, said receiver device further comprising a digital indicator with two six-digit numbers for alternately representing on the one hand the values of the hyperbolic position loci of both fundamental pairs of a locating link or chain and on the other hand for each one of the pairs the coincidence difference of the fundamental phase and of the ambiguity-removing phase through two digits representing the unit and the tenth of revolution, whereas the display of the difference is temporarily substituted for the display of the fundamental phase.

6. A receiver device for radio-position-finding in which the position of a vehicle is determined by the intersection of an iso-phase shift hyperbola line of a first family of radio frequency waves with the iso-phase shift hyperbola line of a second family of radio frequency waves and advantageously by ambiguity-removing frequency waves, each family comprising a pair of fundamental radio frequency waves separated by a position-finding low frequency and a reference radio frequency wave modulated by the low frequency separating said fundamental waves and serving as a reference low frequency, the low frequencies of said families being different from one another, and wherein the low frequency position-finding frequency is developed from each pair of fundamental waves, the low reference frequency modulated thereon is developed from the reference radio frequency wave, the corresponding low frequencies are developed from said ambiguity-removing frequency waves, and the position of the vehicle is established by determining the relative phase between the position-finding low frequencies and the reference low frequencies of each family of radio frequency waves, and wherein said fundamental waves, said reference waves and said ambiguity-removing waves are received in successive cycles during predetermined successive time periods within each cycle, respectively, the relative phase of the corresponding low frequencies received sequentially and developed sequentially is established, and said relative phase values are corrected by computation by a correction value obtained by averaging the phase shift differences measured during each cycle on the same signal, said receiver device being used on a vehicle in order to determine the position thereof and being adapted to receive said two radio frequency wave families each comprising a pair of radio-position-finding frequency waves separated by a low frequency forming a position-finding low frequency and a reference radio wave modulated by said low frequency forming a reference low frequency, advantageously by ambiguity-removing frequency waves, said pairs of position-finding radio frequency waves being situated in a first frequency band, said reference radio frequency waves being situated in a second frequency band and said ambiguity-removing frequency waves being situated in a third frequency band, said receiver device comprising a single receiver channel the tuning frequency of which is switchable over onto said different frequency bands during successive time periods and a microprocessor system adapted for controlling the switching of said receiver channel and for establishing said relative phase of each family of radio frequency waves and of the average phase shift differences forming said correction values and taking into account the shift in time of the measuring of the position-finding low frequencies with respect to the reference low frequencies due to the sequential switching of said single receiver channel on said different frequency bands and for correcting said relative phase values by said correction values, wherein said receiving channel comprises a series connection of an input amplifier, a mixer, an intermediate frequency amplifier and an amplitude detector, and a local oscillator associated with said mixer, said input amplifier and local oscillator being tunable under the control of said logical microprocessor device via a data bus with nine conductors defining at each moment in a binary digital manner the central frequency being amplified, said logical microprocessor device further comprising two multiplexer devices, each provided with a series of capacitors for the automatic control of the gains of the amplifiers under the simultaneous action of two logical signals supplied by said logical microprocessor device.

7. A receiver device according to claim 6, wherein said input channel is adapted to cyclically acquire within a short time less than 0.6 second a maximum number of four frequency bands located in the maritime range lying between 1.6 and 2.6 MHz in response to said data bus.

8. A receiver device for radio-position finding in which the position of a vehicle is determined by the intersection of an iso-phase shift hyperbola line of a first family of radio frequency waves with the iso-phase shift hyperbola line of a second family of radio frequency waves and advantageously by ambiguity-removing frequency waves, each family comprising a pair of fundamental radio frequency waves separated by a position-finding low frequency and a reference radio frequency wave modulated by the low frequency separating said fundamental waves and serving as a reference low frequency, the low frequencies of said families being different from one another, and wherein the low frequency position-finding frequency is developed from each pair of fundamental waves, the low reference frequency modulated thereon is developed from the reference radio frequency wave, the corresponding low frequencies are developed from said smbiguity removing frequency waves, the position of the vehicle is established by determining the relative phase between the position-finding low frequencies and the reference low frequencies of each family of radio frequency waves, and wherein said fundamental waves, said reference waves and said ambiguity-removing waves are received in successive cycles during predetermined successive time periods within each cycle, respectively, the relative phase of the corresponding low frequencies received sequentially and developed sequentially is established, and said relative phase values are corrected by computations by a correction value obtained by averaging the phase shift differences measured during each cycle on the same signal, said receiver device being used on a vehicle in order to determine the position thereof and being adapted to receive said two radio frequency wave families each comprising a pair of radio-position-finding frequency waves separated by a low frequency forming a position-finding low frequency and a reference radio wave modulated by said low frequency forming a reference low frequency, advantageously by ambiguity-removing frequency waves, said pairs of position-finding radio frequency waves being situated in a first frequency band, said reference radio frequency waves being situated in a second frequency band and said ambiguity-removing frequency waves being situated in a third frequency band, said receiver device comprising a single receiver channel the tuning frequency of which is switchable over onto said different frequency bands during successive time periods and a microprocessor system adapted for controlling the switching of said receiver channel and for establishing said relative phase of each family of radio frequency waves and of the average phase shift differences forming said correction values and taking into account the shift in time of the measuring of the position-finding low frequencies with respect to the reference low frequencies due to the sequential switching of said single receiver channel on said different bands and for correcting said relative phase values by said correction values, wherein for the steps of measuring the low frequency signal phase shifts performed under the control of a microprocessor program, said logical microprocessor device comprises at its input two flip-flop devices adapted to receive the low frequency signals and arranged to be reset at a predetermined time and to be put in the state 1 at the reception of a low frequency signal, and means for counting the time between the resetting and the putting into the state 1 as well as computation means adapted to correlate through proportionality computation the time measured at the presumed period of said signal in order to obtain an instantaneous phase shift value expressed as a fraction of revolution.

9. A receiver device for radio-position-finding in which the position of a vehicle is determined by the intersection of an iso-phase shift hyperbola line of a first family of radio frequency waves with the iso-phase shift hyperbola line of a second family of radio frequency waves and advantageously by ambiguity-removing frequency waves, each family comprising a pair of fundamental radio frequency waves separated by a position-finding low frequency and a reference radio frequency wave modulated by the low frequency separating said fundamental waves and serving as a reference low frequency, the low frequencies of said families being different from one another, and wherein the low frequency position-finding frequency is developed from each pair of fundamental waves, the low reference frequency modulated thereon is developed from the reference radio frequency wave, the corresponding low frequencies are developed from said ambiguity-removing frequency waves, and the position of the vehicle is established by determining the relative phase between the position-finding low frequencies and the reference low frequencies of each family of radio frequency waves, and wherein said fundamental waves, said reference waves and said ambiguity-removing waves are received in successive cycles during predetermined successive time periods within each cycle, respectively, the relative phase of the corresponding low frequencies received sequentially and developed sequentially is established, and said relative phase values are corrected by computation by a correction value obtained by averaging the phase shift differences measured during each cycle on the same signal, said receiver device being used on a vehicle in order to determine the position thereof and being adapted to receive said two radio frequency wave families each comprising a pair of radio-position-finding frequency waves separated by a low frequency forming a position-finding low frequency and a reference radio wave modulated by said low frequency forming a reference low frequency, advantageously by ambiguity-removing frequency waves, said pairs of position-finding radio frequency waves being situated in a first frequency band, said reference radio frequency waves being situated in a second frequency band and said ambiguity-removing frequency waves being situated in a third frequency band, said receiver device comprising a single receiver channel the tuning frequency of which is switchable over onto said different frequency bands during successive time periods and a microprocessor system adapted for controlling the switching of said receiver channel and for establishing said relative phase of each family of radio frequency waves and of the average phase shift differences forming said correction values and taking into account the shift in time of the measuring of the position-finding low frequencies with respect to the reference low frequencies due to the sequential switching of said single receiver channel on said different frequency bands and for correcting said relative phase values by said correction values, said receiver device further comprising a processing and display device which includes for the processing of each ambiguity-removing phase dividing means adapted to perform under the control of a program the division of the estimated fundamental phase by an ambiguity-removing ratio (n) detected in said program by that network where said receiver device is located, means for retaining the fractional part of the result of said division, comparator means for substracting from that result the ambiguity-removing phase, correcting means for possible correcting that uncorrected coincidence difference, means for multiplying said result by said ratio (n) for obtaining a datum of the same sensitivity as that of the fundamental phase centered about a zero value and representing n/2 revolutions for the positive difference and (10−n/2) revolution for the negative differences.

* * * * *